United States Patent [19]

Yanagawa et al.

[11] Patent Number: 5,661,404

[45] Date of Patent: Aug. 26, 1997

[54] CIRCUIT NETWORK MEASUREMENT DEVICE AND CALIBRATION METHOD

[75] Inventors: Koichi Yanagawa; Atsushi Ishihara; Hiroyuki Iwai; Tatsuo Furukawa, all of Hyogo, Japan

[73] Assignee: Hewlett-Packard Company, Palo Alto, Calif.

[21] Appl. No.: 503,092

[22] Filed: Jul. 17, 1995

[30] Foreign Application Priority Data

Jul. 27, 1994 [JP] Japan .................................. 6-194818

[51] Int. Cl.$^6$ ................................................ G01R 35/00
[52] U.S. Cl. ...................... 324/601; 324/130; 364/571.01
[58] Field of Search ............................ 324/601, 130; 364/571.01; 73/1 R

[56] References Cited

U.S. PATENT DOCUMENTS

| | | | |
|---|---|---|---|
| 4,808,912 | 2/1989 | Potter et al. | 324/601 |
| 4,853,613 | 8/1989 | Sequeira et al. | 324/601 |
| 4,982,164 | 1/1991 | Schiek et al. | 324/601 X |
| 5,047,725 | 9/1991 | Strid et al. | 324/601 |
| 5,248,933 | 9/1993 | Venditti | 324/74 |
| 5,313,166 | 5/1994 | Eul et al. | 324/601 |
| 5,351,009 | 9/1994 | Hutch | 324/601 |
| 5,434,511 | 7/1995 | Adamian et al. | 324/601 |
| 5,578,932 | 11/1996 | Adamian | 324/601 |
| 5,587,934 | 12/1996 | Oldfield et al. | 364/571.01 |

OTHER PUBLICATIONS

HP 4380S—RF Balanced Cable Evaluation Test System Product Overview—Mar. 1995—Hewlett-Packard Company, pp. 1–4.

HP 8753C—Network Analyzer Operating Manual—Jan. 1992—Hewlett-Packard Company, pp. 5–53 to 5–64.

*Primary Examiner*—Glenn W. Brown

[57] ABSTRACT

A system and a method are presented which reduce the number of times of connection and disconnection of calibration standards in a circuit network measurement device provided with many measurement ports. The circuit network measurement device generally includes a network analyzer and a test set. A calibration port is provided and typically placed in the test set. The calibration port consists of a connector and three standards (open, short, and load impedances) connected to the connector internally by means of a selection switch. The measurement port of the circuit network measurement device is calibrated by using the three external impedance standards. The calibrator is calibrated by connecting the measurement port calibrated at the former step. Other measurement ports are then connected to the calibrator to be calibrated. Because the three impedances of the internal calibrator are automatically selected by a switch of the calibrator, by means of logical control, the number of times the standards are connected and disconnected is reduced.

2 Claims, 2 Drawing Sheets

CIRCUIT NETWORK MEASUREMENT DEVICE AND CALIBRATION METHOD

FIELD OF THE INVENTION

This invention concerns circuit network measurement devices in general; in particular, it concerns a calibrator which calibrates circuit network measurement devices having many measurement ports, and a calibration method.

BACKGROUND OF THE ART

FIG. 3 shows an example of the prior art two-port circuit network measurement devices. This arrangement is generally called an "S parameter test system," "network analyzer system," or "impedance analyzer." These systems consist of a network analyzer 1 and a lower test set 2. However, there are also devices in which both parts are combined into one. Here, we shall take the general separate-type S parameter test system as an example.

The test set is provided with a number of bridges equal to the number of measurement ports, which conduct the measurement signals from the network analyzer to the circuit being measured and separate the transmitted and the reflected signals necessary to measure the S parameters. That is, in the case of two-ports, 2 sets of bridges are provided. The reception of the measurement signals between the network analyzer and the test set is performed through four coaxial cables 3. In addition, although they are not shown in the figure, suitable cables also generally connect the network analyzer and the test set at their rear panels, for power supply access and to exchange control signals. Moreover, there are also cases in which the circuit network measurement device is controlled by a computer (although this is also not shown in the figure).

Two connectors 5, serving as measurement ports, are provided on test set 2. Ordinarily, the types of these connectors are N, BNC, or APC-7, etc., coaxial connectors. When a circuit network being measured is connected directly to these two connectors 5, the connectors become reference planes, i.e., the measurement ports. However, the circuit network to be measured is rarely connected directly to connectors 5; generally, coaxial cables 6 are connected to connectors 5, and the circuit network to be measured is connected to connectors 7 at the front ends of coaxial cables 6. At such time, connectors 7 at the ends of cables 6 become the measurement ports (reference planes of the measurements). In FIG. 3, the connectors on the test set side of coaxial cables 6 are omitted from the diagram.

Among the methods for calibrating the circuit network measurement device, the full two-port calibration method is known as the best method. The full two-port calibration method consists of (a) one-port calibration, (b) isolation calibration, and (c) through calibration. In one-port calibration, three known impedances are prepared as standards; the port is calibrated by connecting these standards successively to one port. The same calibration is also performed on the other port.

Ordinarily, the three known impedances used are open, short, and load. In isolation calibration, each port is terminated and the isolation between the ports, i.e., leakage signal, is measured. In through calibration, the ports are connected directly to each other, and the transmission properties are measured. The errors in these three measurements are calculated, and are corrected. Details of the full two-port calibration method are given in the following reference: "Accuracy Enhancement Fundamentals—Characterizing Microwave Systematic. Errors," HP 8753C Network Analyzer Operating Manual, Reference Section, Appendix to Chapter 5.

The case in which there are two measurement ports was discussed above. In complex circuit networks that are to be measured, two measurement ports are insufficient, and many measurement ports are necessary. The method of calibration is the same for the case in which many measurement ports are provided. As shown below, however, when the number of measurement ports becomes large, the number of combinations of measurement ports becomes large, and the calibration standards and cables, etc., must be reconnected many times. As a result, not only the work and time involved become problems, but abrasion and damage to the connection planes of the connectors and connection mistakes, etc., become problems.

Here, the number of times the standards and cables are connected and disconnected shall be considered when a circuit network measurement device with n measurement ports is calibrated by the full two-port method. Cables 6 are connected to test set 2. This connection is not counted as the number of connections and disconnections, since it is not related to calibration. In one-port calibration, three standards are connected and disconnected per measurement port, so that the number of connections and disconnections is 3 n. In isolation calibration, if it is assumed that n terminal resistances are prepared and that the measurements are performed after all the ports are terminated, there are n connections and disconnections. However, the number of measurements is the number of combinations of two-ports selected from n ports, or nC2. In through calibration, the number is the number of combinations of two-ports selected from the measurement ports of the ends of n cables, so that it is either nC2 (when the connectors can be connected to each other) or nC2+1 (when intermediate adapters are necessary for the connection).

From these facts, it can be seen that when n is six or less, the number of connections and disconnections for one-port calibration is greater than for others, and when n is seven or greater, the number of connections and disconnections for through calibration is the most.

OBJECT OF THE INVENTION

The object of this invention is to provide a calibration devices and method of calibration to reduce the number of erroneous reconnections of cables and calibration standards, to reduce the labor and time for connecting the calibration standards, etc., and also to reduce the abrasion and damage to the connection planes of the calibration standards.

SUMMARY OF THE INVENTION

This invention reduces the number of times the standards for one-port calibration are connected in the full two-port calibration method by providing an internal calibrator, and reduces abrasion, damage, and connection mistakes of the expensive external standards. The calibrator is designed so that three standards can be selected by a switch. One measurement port is first calibrated by using highly-accurate external standards at the time of the calibration. The port is used for calibration of the internal calibrator. Each other ports is then connected to the calibrated internal calibrator for calibration. The switch is switched by a logical control.

DETAILED DESCRIPTION OF THE PREFERRED EMBODIMENT

As mentioned above, the number of connections and disconnections of standards, etc. in one-port calibration is greater if the number of measurement ports n is six or less, and the number in the through calibration is greater if n is seven or bigger. In through calibration, the connections and disconnections are made among the connectors on the front ends of the cables, and there are no problems of abrasion and damage to the expensive standards (as there are in one-port calibration). Therefore, if the value of n is in the order of one decimal, it is more effective to reduce the number of connections and disconnections in the one-port calibration. Therefore, this invention describes a method for reducing the number of connections and disconnections in one-port calibration.

Figure 1:
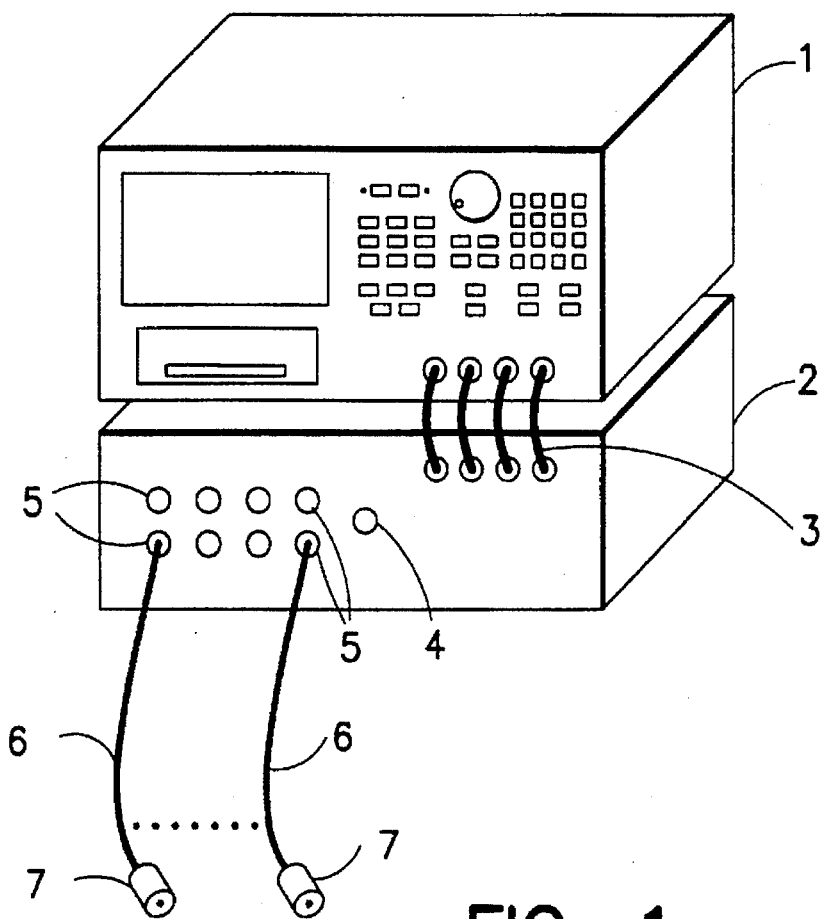
FIG. 1 shows an actual example of this invention.
Figure 3:
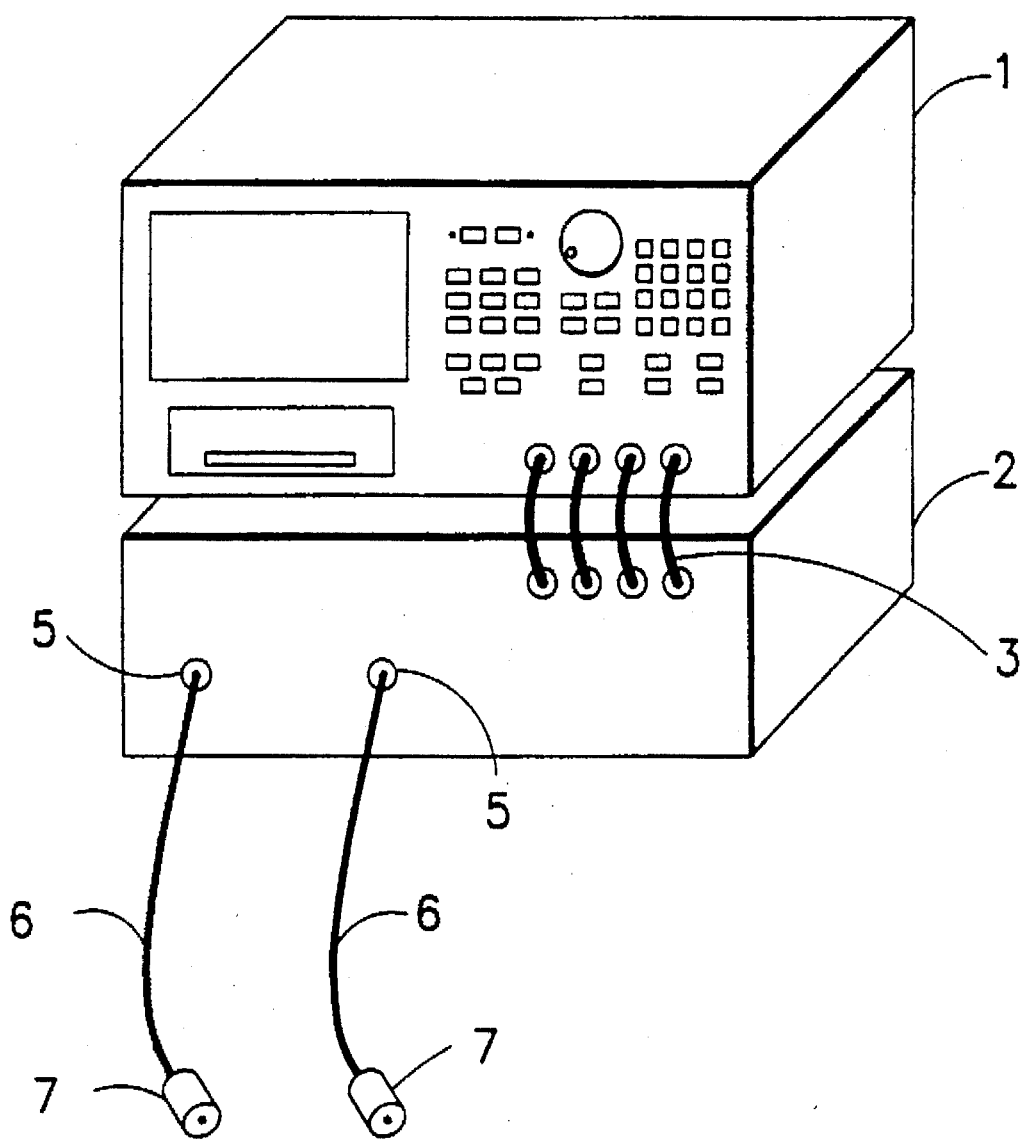
FIG. 3 shows an example of prior art technology.
Explanation of Symbols
1: network analyzer
2: test set
3: coaxial cables
4: calibration port
5: coaxial connectors
6: coaxial cables
7: coaxial connectors
11: coaxial connector
12: switch
13: switch terminal
14: switch terminal
15: shunt
16: standard resistor
17: switch terminal

An example of this invention is shown in FIG. 1. The elements with the same functions as in FIG. 3 are given the same reference numbers. In this case, the test set in the FIG. 1 shows an example with 8 ports. This invention is characterized by an internal calibrator, of which terminal is used as a calibration port 4. The internal part of test set 2 of FIG. 1, compared to the test set of FIG. 3, is the same, except that it is provided with an internal calibrator and eight measurement bridges.

Figure 2:
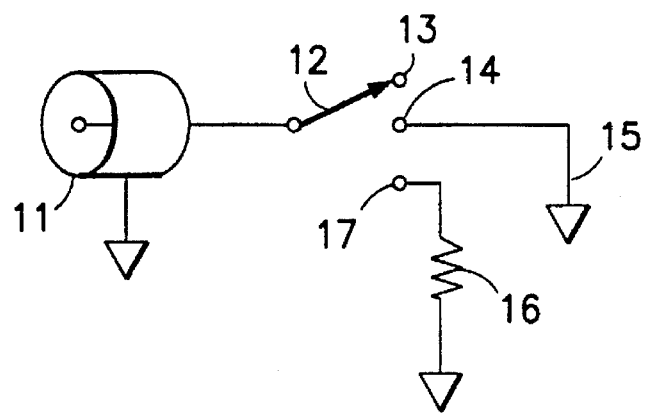
FIG. 2 shows the principle of an actual example of the internal calibrator of this invention.

Calibration port 4 is made so that any one of three internal known impedances, i.e., "open," "short," and "load," can be selected. FIG. 2 shows the principle of the preferred embodiment. It comprises the three known impedances, as "open," "short," and "load", a switch 12 and a connector 11. "Open" is the state in which terminal 13 of switch 12 is open. "Short" is realized as the state in which terminal 14 of the switch 12 is connected to the ground by shunt 15. The "load" is implemented by connecting a standard resistor 16 to terminal 17 of the switch. The value of the standard resistor has no limitation, but if it is made equal to the characteristic impedance of the circuit network, a highly accurate calibration is easily performed. Connector 11 of the figure is fixed to the front panel of test set 2 to comprise calibration port 4. Switch 12 switches among "open," "short," and "load," according to the order of calibration, which is done by the logic control of a network analyzer or an external computer (not shown in the figure).

The method of calibration of this invention is as follows. Similar to the prior art technology, it is assumed that coaxial cables 6, which are connected to the circuit network to be measured, are connected to terminals 5 of test set 2. In FIG. 1, however, not all the coaxial cables are shown. In this state, coaxial connectors 7 on the ends of cables 6 become the measurement ports (measurement reference planes).

First, any one of the eight measurement ports is arbitrarily selected, and one-port calibration is performed by using external highly-accurate standards. At this time, the "open," "short," and "load" external standards are connected and disconnected one by one, three connections and three disconnections are done at this time.

After this one-port calibration, the measurement port is calibrated by highly-accurate standards. Next, coaxial connector 7 of cable 6 of the calibrated measurement port is connected to calibration port 4, and the "open," "load," and "short" of the internal calibrator are measured. As a result, the internal calibrator is evaluated essentially with the accuracy of the external standards. One connection and one disconnection are performed at this time. Next, the coaxial connectors on the ends of the coaxial cables of the remaining seven ports are successively connected to calibration port 4, and the three standards of the internal calibrator, i.e., "open", "load," and "short," are measured. If these measurement values are corrected so that they are equal to the value of the evaluated internal calibrator, the remaining seven ports are also calibrated with the accuracy of the external standards. Thus, a total of 11 connections and disconnections was done.

According to the conventional method, one-port calibration is done by connecting and disconnecting three standards at eight measurement ports. In this case, the total number of connections and disconnections is 3×8=24. In general, when there are n measurement ports, the number of connections and disconnections of this invention is as follows. There are three connections and disconnections of the external standards for one measurement port, and the coaxial connectors of the cables of the n measurement ports are connected and disconnected n times to calibration port 4, summing up to a total of 3+n connections and disconnections. Since the conventional calibration method requires 3 n connections and disconnections for one-port calibration, this invention greatly reduce the number of connections and disconnections to approximately ⅓rd, when n is large.

Ordinarily, reflection coefficients for the "open," "load," and "short" standards must be 1, 0, and −1, respectively. However, the internal calibrator of this invention is calibrated by a measurement port that has been calibrated by highly-accurate external standards. Since the remaining measurement ports are calibrated after this, it is enough that the internal calibrator should be stable only during the time (typically around 15 minutes) when all ports are being calibrated, and it is sufficient for the reflection coefficients to be approximately 0.9, 0.1, and −0.9. That is, since we can make internal calibrator by using simple low cost components, we can minimize the cost by incorporating the standards.

In the preferred embodiment described above, the internal calibrator is included in the test set, but it may also be included in the network analyzer, or it can be a completely separate device.

Moreover, since the requirement for the three calibrators for one-port calibration is having values separate from each other, they need not be "open," "load," and "short." By means of this invention, the number of connections and disconnections of the standards in the one-port calibration are reduced, as well as the labor, time, damage to the connectors of the standards, and mistakes in operation.

In the preferred embodiment, the measuring of S parameters was discussed, but the measurement device and the measurement quantities may also be other than those for S parameters.

A preferred embodiment of the present invention was described above, but it is not limited to the mode, forms of parts, arrangement, or other aspects of the example shown; if desired, changes in the make-up are allowed as long as the concept of this invention is not lost.

What is claimed is:

1. A method for calibration of a circuit network measurement device through use of plural external impedance standards, said circuit measurement device including plural measurement ports and a calibrator with plural internal impedance standards, said method comprising the steps of:

(a) calibrating one of said measurement ports by sequential connection of plural external impedance standards thereto;
    (b) calibrating said plural internal impedance standards by use of said one of said measurement ports that was calibrated in step (a); and
    (c) calibrating other of said plural measurement ports by use of said calibrator with said plural internal impedance standards calibrated in step (b).

2. The method as recited in claim 1, wherein said plural internal impedance standards are for open, short and load impedances.

* * * * *